United States Patent
Taylor et al.

(10) Patent No.: US 10,680,152 B1
(45) Date of Patent: Jun. 9, 2020

(54) PASSIVE THERMAL OSCILLATORS

(71) Applicant: U.S. Army Research Laboratory, Adelphi, MD (US)

(72) Inventors: Patrick J. Taylor, Vienna, VA (US); Jay Maddux, Greenbelt, MD (US); Adam A. Wilson, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/222,773

(22) Filed: Dec. 17, 2018

(51) Int. Cl.
*H01L 35/28* (2006.01)
*H03L 1/02* (2006.01)
*H01L 37/04* (2006.01)
*H01L 37/02* (2006.01)

(52) U.S. Cl.
CPC .............. *H01L 35/28* (2013.01); *H01L 37/02* (2013.01); *H01L 37/04* (2013.01); *H03L 1/02* (2013.01)

(58) Field of Classification Search
CPC ......... H01L 35/28; H01L 37/02; H01L 37/04; H03L 1/02
See application file for complete search history.

(56) References Cited

U.S. PATENT DOCUMENTS

| 9,252,704 | B2 | 2/2016 | Nayfeh et al. | |
| 2009/0293500 | A1* | 12/2009 | Chen | F25B 21/02 62/3.7 |
| 2012/0313709 | A1* | 12/2012 | Lautzenhiser | H03F 1/301 330/285 |
| 2017/0098748 | A1* | 4/2017 | Steutermann | H01L 35/28 |

OTHER PUBLICATIONS

Technical Data Sheet for TG12-8, Single-Stage Thermoelectric Generator, Marlow Industries Inc. Available online at: https://cdn2.hubspot.net/hubfs/547732/Data_Sheets/TG12-8.pdf prior to filing.

* cited by examiner

*Primary Examiner* — Jeffrey M Shin
(74) *Attorney, Agent, or Firm* — Eric B. Compton

(57) ABSTRACT

A passive thermal oscillator combines a thermoelectric device and a passive analog electrical circuit to produce a time-oscillating temperature difference. The oscillator makes use of a temperature difference imposed across a thermoelectric device to produce a Seebeck voltage to periodically trigger electrical current to pass through a switch. The periodic electrical current causes periodic Peltier cooling producing a time-oscillating temperature difference across the thermoelectric device. There is no requirement for additional external energy input because the thermal energy generates a voltage that is used as the driving force. The operation is purely passive. So long as there is a temperature difference across the thermoelectric device, then the passive thermal oscillator oscillates. The passive thermal oscillator can integrate multiple energy conversion device technologies to operate cooperatively. The cooperation of multiple energy conversion technologies yields a much higher overall system efficiency than just the conversion of thermal energy into electrical energy.

15 Claims, 4 Drawing Sheets

PASSIVE THERMAL OSCILLATORS

GOVERNMENT INTEREST

The invention described herein may be manufactured, used and licensed by or for the U.S. Government without the payment of royalties thereon.

BACKGROUND OF THE INVENTION

Field of Invention

The present invention relates to thermal oscillators, and more particularly to, passive thermal oscillators.

Description of Related Art

To date, a periodically oscillating temperature difference has only been possible by active electrical control that requires active external electrical input. A passive system would be useful.

BRIEF SUMMARY OF THE INVENTION

According to embodiments, the passive thermal oscillator of the present invention uniquely combines a thermoelectric device and a passive analog electrical circuit to produce a time-oscillating temperature difference. The thermoelectric device is configured to generate an electrical output from thermal energy. The passive analog electrical circuit comprises an electrically-controlled switch and a switch biasing component configured to control the electrical current to pass or cease to pass through the switch. In preferred embodiments, the passive analog electrical circuit is formed of only solid-state electrical components.

The oscillator makes use of a temperature difference imposed across the thermoelectric device to produce a Seebeck voltage to periodically trigger electrical current to pass through the switch to a load causing periodic Peltier cooling producing a time-oscillating temperature difference across the thermoelectric device. There is no requirement for any additional external energy input because the thermal energy generates a voltage that is used as the driving force. The operation is purely passive. So long as there is a temperature difference available across the thermoelectric device, then the passive thermal oscillator can oscillate into perpetuity.

More particularly, the switch biasing component controls the operation of the switch by triggering current to pass and cease to pass through the switch thereby causing the thermoelectric device to output an oscillating time dependent temperature response. The electrically-controlled switch may be a transistor, as one non-limiting example. And the switch biasing component may be a transistor-gate biasing component (such as a diode) in which the gate of the transistor will be biased when the voltage of the thermoelectric device exceeds the reverse-bias breakdown value or rating of the diode.

Preferably, but not limiting, the oscillator receives a constant or static thermal (heat) input, and the oscillating time dependent temperature response is substantially periodic with each period comprising a first region and a second region. In the first region, current does not pass through the switch, and the temperature of the thermoelectric device rises until the output voltage of the thermoelectric device reaches the set trigger voltage for the switch biasing component. Next, in the second region, current passes through the switch, and the temperature of the thermoelectric device decreases until the output voltage drops below the trigger voltage for the switch biasing component. The temperature response in the first region may be characterized as follows:

$$\Delta T(t) = \frac{Q_{input}}{K}\left(1 - \exp^{\frac{-K}{nC_v}t}\right);$$

and
the temperature response in the second region may be characterized as follows:

$$\Delta T(t) = \frac{(Q_{input} + I^2 R - \Pi * I)}{K}\left(1 - \exp^{\frac{-K}{nC_v}t}\right).$$

Here, $\Delta T(t)$ is the change of temperature of the thermoelectric device, t is time, $Q_{input}$ is the heat flow input, $\Pi$ is the Peltier coefficient of the thermoelectric device, I is the magnitude of the electrical current, R is the electrical resistance of the thermoelectric device that acts counter to the Peltier heat, K is the thermal conductance of the thermoelectric, $C_v$ is the molar specific heat at constant volume, and n is the molar mass of the material receiving the heat.

In some implementations, the oscillator may further include terminals electrically connecting the passive analog electrical circuit to the thermoelectric device. The terminals may be comprise wires, electrodes, traces, or electrical conductors, for instance.

The passive thermal oscillator can also integrate multiple energy conversion device technologies and enables them to operate cooperatively. For instance, a Curie point energy converter may be connected to the thermoelectric device in some embodiments. Curie point energy converters may include: a pyroelectric energy conversion device, a pyroferroelectric energy conversion device, or a magnetocaloric energy conversion device, as non-limiting examples. The cooperative operation of the multiple energy conversion technologies can yield a much higher overall system efficiency for the conversion of thermal energy into electrical energy.

These and other embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

DETAILED DESCRIPTION

The novel passive thermal oscillator of the present invention uniquely combines a thermoelectric device and a passive analog electrical circuit to produce a time-oscillating temperature difference across the thermoelectric device.

Figure 1:
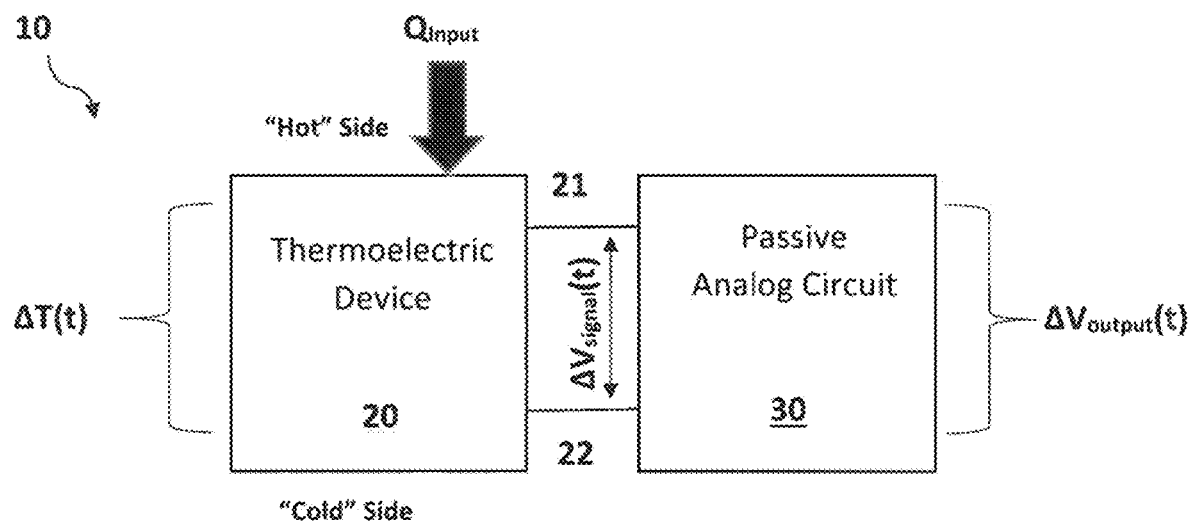
FIG. 1 shows a schematic of a passive thermal oscillator according to embodiments of the present invention.

FIG. 1 shows a schematic of a passive thermal oscillator 10 according to embodiments. The passive thermal oscillator 10 includes a thermoelectric device 20 and a passive analog electrical circuit 30.

The passive thermal oscillator 10 produces a time-varying temperature difference in response to an imposed static, nominally constant temperature difference. It uses the adventitious energy within the system to drive the oscillation, and is therefore entirely self-powered. No external electrical input power is necessary.

The thermoelectric device 20 accepts a thermal (heat) input, $Q_{input}$. Preferably, the oscillator receives a constant or static thermal (heat) input. The constant or static heat input generates a sinusoidal thermal oscillation which is highly periodic and regular. The thermoelectric device could also accept a time-varying thermal (heat) input, and still work but it would not have a periodic waveform. The non-constant heat input would generate an arbitrary output that is consistent with that input.

In this particular illustration, the top surface of the device 20, where the heat input, is received may be referred to as the "Hot" side," whereas the bottom surface of device, opposite to the heat input, may be referred to as the "Cold" side. The device 20 generates a variable time-dependent temperature difference, $\Delta T(t)$, between the "Hot" side and "Cold" side of the device 20 which, in turn, generates a variable voltage output signal $\Delta V_{signal}(t)$ across the electrical terminals 21 and 22 of the thermoelectric device 20.

The terminals 21 and 22 electrically connect the thermoelectric device 20 and the passive analog electrical 30 allowing voltage to flow there between. The terminals 21 and 22 may be wires, electrodes, traces, or other electrical conductors. They may be formed on copper, gold, or other highly-conductive metal, for instance.

The thermoelectric device 20 may be any device which converts thermal (heat) energy into electrical energy or vice versa. It may be a thermoelectric energy converter in various embodiments. One example of a thermoelectric energy converter which may be used in embodiments is the 2411G-7L31-15CX1 Power Generation Module from Custom Thermoelectric Corporation that can output more than 20 Watts of electrical power. Another example is the TG12-8-01LS Power Generator from Marlow Industries that can output 8 Watts of electrical power. However, there are many other commercial devices which may be used for thermoelectric device 20.

In general, a thermoelectric device is formed of two dissimilar thermoelectric materials (e.g., doped semiconductors) joined together at a junction. It may include an n-type (negatively charged) semiconductor and a p-type (positively charged) semiconductor, with each thermoelectric material being electrically connected to a respective one of terminals 21 and 22. When the thermoelectric device 20 is subjected to a temperature difference across the junction, an open circuit voltage will develop, because of the Seebeck effect, and a direct electric current will flow in the circuit when there is a temperature difference between the two materials. The current magnitude of the Seebeck voltage is directly proportional, for most thermoelectric devices, to the temperature difference across the junction.

The electrical terminals 21 and 22 of the thermoelectric device 20 connect to the passive analog electrical circuit 30. The circuit 30 converts the variable time-dependent voltage output signal $\Delta V_{signal}(t)$ into an oscillating time-dependent voltage output signal difference $\Delta V_{output}(t)$ across the load 38 of the circuit 30 by passively switching between open-circuit and closed circuit conditions, as further explained below. The frequency and amplitude of the obtained output signal $\Delta V_{output}(t)$ can be judiciously controlled by the circuit design, and by the thermal design of the thermal masses across the thermoelectric device.

$\Delta V_{signal}(t)$ and $\Delta V_{output}(t)$ are related: $\Delta V_{output}(t)$ is the useful quantity for electrical power generation and $\Delta V_{signal}(t)$ is the control of the output. For example, with any time-varying heat input, a useful time-varying output electrical power would be obtained and be available for doing work. If a secondary time-varying output electrical power generator (e.g., pyroelectric) is integrated, then the output from both is additive (e.g. the electrical power from $\Delta V_{output}(t)$ plus the pyroelectric device would yield the total generated power).

In general, the passive analog electrical circuit 30 may be composed of an electrically-controlled switch, a switch biasing component, and perhaps, some optional electrical components (e.g., one or more resistors), that together, operate as a voltage trigger circuit. The function of the passive analog electrical circuit 30 is to switch between open-circuit and closed-circuit at the output of the thermoelectric device, and allow electrical current to periodically flow (short-circuit or closed-circuit) and not flow (open-circuit) through the thermoelectric device without any external electrical power.

More particularly, when the open-circuit Seebeck voltage of the thermoelectric device 20 exceeds the trigger voltage of the circuit 30, the switch biasing component turns the switch to an "on" state, and a large electrical current flows through the thermoelectric device and switch because the switch is short-circuiting it. The large current through the thermoelectric device causes the static temperature difference to decrease because of heat absorption (cooling) directly associated with the Peltier effect. The primary effect from the decrease in the temperature difference is that the Seebeck voltage decreases.

If the Seebeck voltage drops below the trigger voltage of the circuit 30, then the switch returns to an "off" state and the electrical current through the switch stops. When electrical current through the switch stops, then Peltier heat absorption stops, and the temperature difference will rise back to the original value. This open-circuit and closed-circuit cyclic repeat establishes the basis for producing the periodic temperature oscillation.

Figure 2:
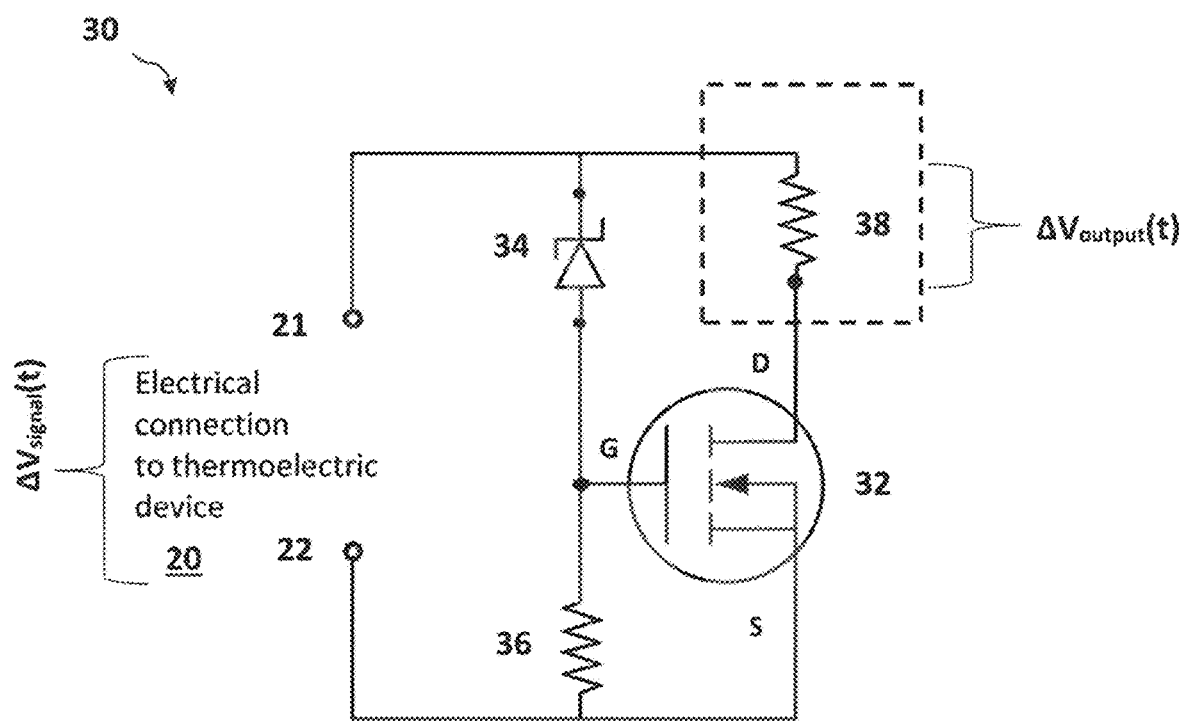
FIG. 2 shows one example of the passive analog electrical circuit according to an embodiment of the present invention.

FIG. 2 shows one example of the passive analog electrical circuit 30 according to an embodiment of the present invention. Preferably, the passive analog electrical circuit 30 is formed of only solid-state components that are assembled into a passively powered electrical circuit.

As shown, the passive analog electrical circuit 30 includes a transistor 32, transistor-gate biasing component 34, biasing resistor 36, and load 38. The transistor 32 may be an enhancement mode (normally-off) power transistor, for instance. As shown, it may be a field effect transistor (FET), as a non-limiting example. It accepts the voltage output $\Delta V_{output}(t)$ of the thermoelectric device 20 across the electrical terminal 21 and 22.

The passive electrical circuit 30 is configured to switch between an open-circuit configuration and a short-circuit (or closed-circuit) configuration in response to the voltage output $\Delta V_{signal}(t)$ of the thermoelectric device 20.

The transistor-gate biasing component 34 may be a discrete electrical component (or components) that can apply switching bias to the gate G of the transistor 32. It may be a diode, inductor, capacitor, or resistor-capacitor-inductor timing circuit, for instance. A Zener diode is specifically shown as one non-limiting example. The thermoelectric device 20 is directly connected to the power transistor 32 at the source S and drain D, and is connected at the gate G by the transistor-gate biasing component 34 that acts as a voltage trigger for it. For example, if the transistor-gate biasing component 34 is a Zener diode, the gate G will receive bias when the open-circuit voltage of the thermoelectric device exceeds the Zener diode's reverse-bias breakdown value, or rating. The theoretical value for the reverse-bias voltage is completely tunable from as low as 2 V to as high as 200 V, for instance. For passive-thermal-oscillator circuits formed with commercially available thermoelectric modules, diodes whose trigger voltage is close to 2 V would give the desired operation because the output voltage of the thermoelectric device is in the 1 to 5 V range.

Other embodiments could make use of a capacitor, or resistor-capacitor network tied to the gate of the transistor. The charging of the capacitor would decouple and thus time-delay the thermal oscillation and the electrical bias input to the power transistor.

Initially, the normally-off transistor 32 passes no current. However, when the voltage output $\Delta V_{signal}(t)$ of the thermoelectric device 20 exceeds a critical value (e.g., the trigger voltage of the Zener diode), then a bias is applied at the gate G of the power transistor 32. If the transistor-gate biasing component 34 is a capacitor, the size of the capacitor would be chosen according to the desired oscillation, and the thermal mass seen on the hot-side. A timing circuit based on a combination of a resistor, a capacitor and an inductor would also work and probably produce a more perfect sinusoid, but may suffer two problems: 1.) it would draw parasitic power from the circuit to do so, and be less attractive for both power generation and temperature oscillation. (e.g., the power used for recharging your battery would have to be split/shared with the timing circuit.); and 2.) it would be fighting the oscillation frequency set by the thermal resonance if it was not matched in frequency. The selection of components should be made based on the heat input and thermal mass of the parts, but also based on the desired electrical output.

The bias applied to the gate G will cause the normally-off transistor 32 to switch "on" and a large electrical current will flow through the power transistor 32 and also the thermoelectric device 20 via terminal 21 and 22. The current passing through the thermoelectric device 20 and power transistor 32 is exactly the same, and causes Peltier cooling to reduce the variable time-dependent temperature difference $\Delta T(t)$ across the thermoelectric device 20. The Peltier cooling can be considered as the reverse, or back-action counterpart of, the Seebeck effect.

The resistance of the biasing resistor 36 should be selected to be sufficiently high to make parasitic current flows small (e.g., <0.1%) relative to main current flow through the load 38. The load 38 may include a resistor. Changing the resistance of the resistor of load 38 can adjust the magnitude of that current. The load resistor 38 should be chosen to match the internal resistance of the thermoelectric device to achieve maximum output power at the impedance-matched condition. Exemplary values of the range of resistance for resistor 36 may be greater than about 10 k$\Omega$, and that range for resistor 38 would be impedance-matched to the resistance of the thermoelectric module which is on the order of about 10$\Omega$. Another equivalent embodiment would involve using a simple resistor-capacitor timing circuit to time-delay the on/off switching of the power transistor.

Figure 3:
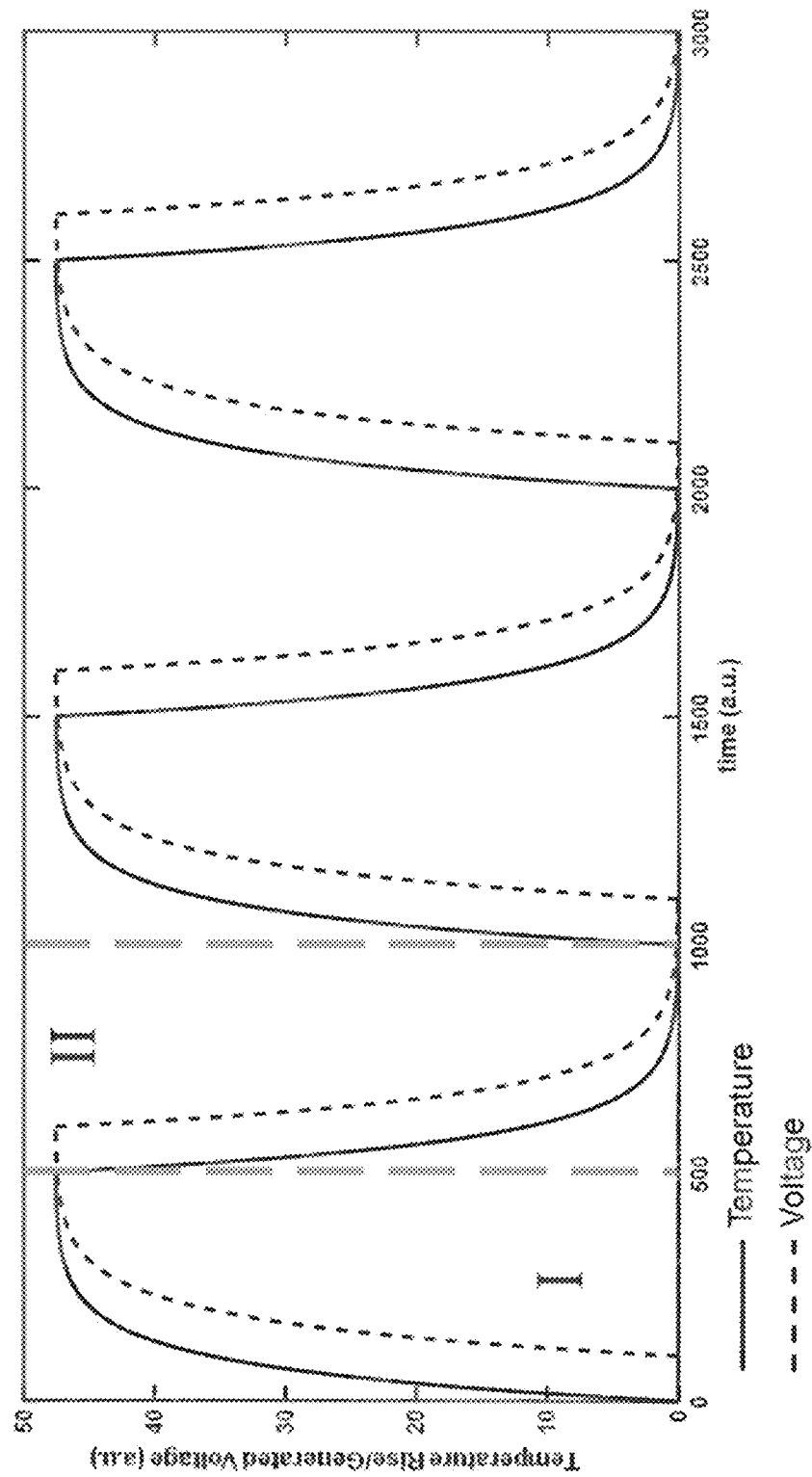
FIG. 3 is a plot showing calculated temperature oscillation of the passive thermal oscillator over time using the passive electrical circuit of FIG. 2.

FIG. 3 is a plot showing calculated temperature oscillation of the passive thermal oscillator over time using the passive electrical circuit 30 of FIG. 2. The temperature difference signal $\Delta T(t)$ and the voltage output signal $\Delta V_{signal}(t)$ which are labelled as "Temperature" and "Voltage," respectively, on the plot. It shows time-dependent operation. The effect of the periodic switching between "on" and "off" states is quite apparent in the calculated temperature oscillation in this plot.

It is noted that there is a lag between voltage and temperature on the plot. The lag is caused by the time needed to warm up the components. So the lag is a function of the specific heat value of all of the components. For example, if a large metal block (like copper) were to be attached to the oscillator, it would could cause a large time delay.

Figure 4:
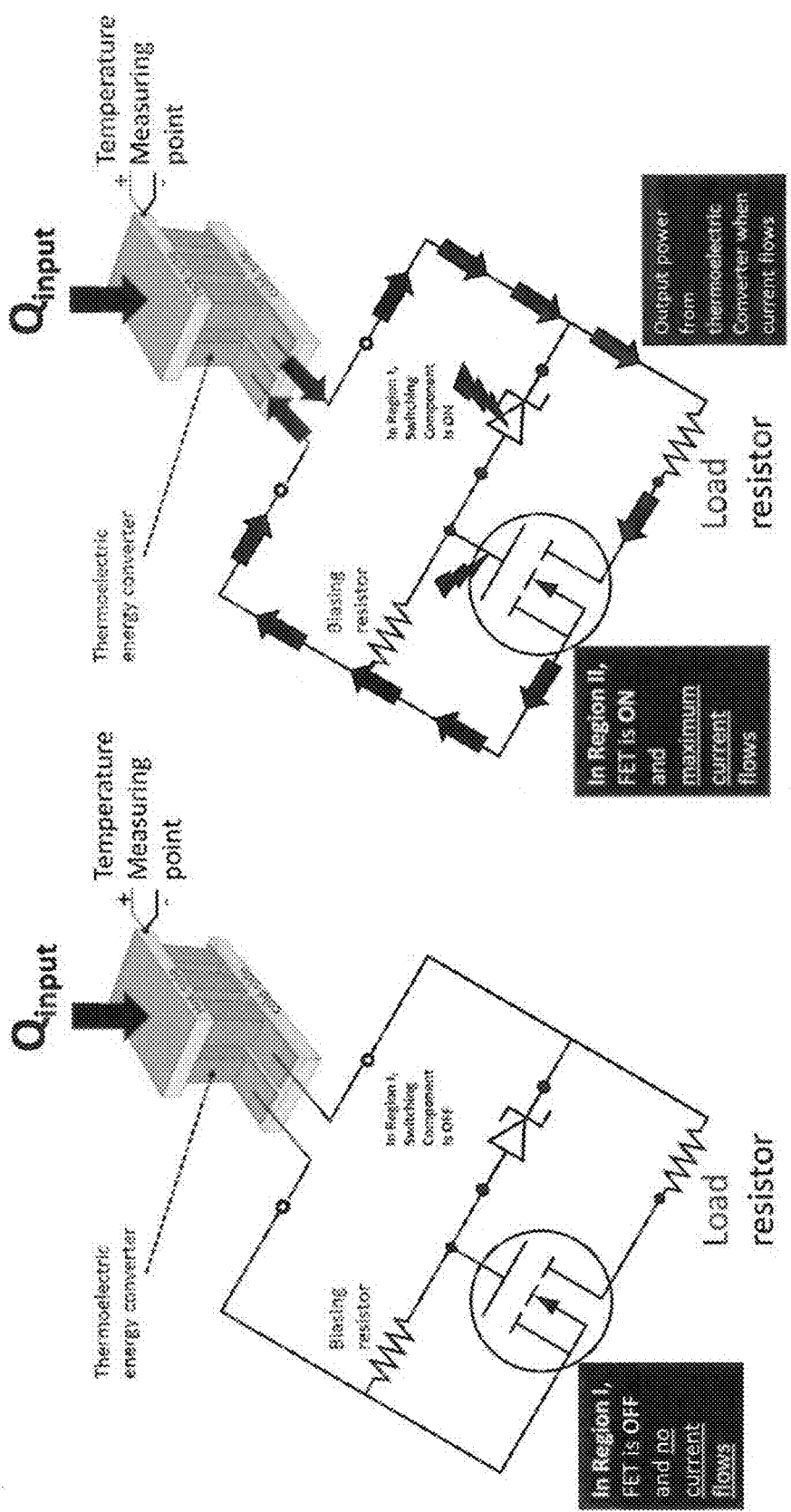
FIG. 4 shows a passive thermal oscillator and its operation when the transistor is turned on and off according to an embodiment.

Although a persistent periodic temperature oscillation is obtained, the behavior shown in the plot is treated as piecewise continuous, i.e., there are two distinct operational regions indicated on the oscillation as regions I and II. Further reference is made to FIG. 4 which illustrates an embodiment of a passive thermal oscillator and operation in regions I and II.

In region I, the temperature across the thermoelectric device is observed to initially rise as the static temperature difference is initially applied. There is no electrical current flows through the power transistor, and likewise no current flows through the thermoelectric device. This condition is shown in the left illustration of FIG. 4.

The voltage across the Zener diode is insufficient to cause voltage triggering at the gate of the transistor. In this region the temperature rise is governed by the thermal conductance, K, of the thermoelectric device as well as the molar specific heat at constant volume, $C_v$, and molar mass, n, of the material receiving the heat. As an example, the material receiving the heat may be a heat exchanger that houses a pyroelectric element. The thermoelectric device receives a heat flow input, $Q_{input}$ that is usually $>>10^2$ Watts of heat. The thermal conductance, K, of the device is typically on the order of <1 Watt/K. The range of thermal mass, n, would vary widely depending on the system design. $Q_{input}$ would be system dependent. For example, $Q_{input}$ for a glass manufacturing plant could be about $10^7$ Watts, whereas for a small handheld device $Q_{input}$ would be $10^3$ Watts.

Some exemplary values for I, R, K, $C_v$, n and H used in embodiments are as follows: I~1 Amperes, R~5 Ohms, K~2 Watts/meter-Kelvin, $C_v$ for copper is ~0.4 Joules/gram-Celsius, n~0.1 mole, and H for a commercial thermoelectric device ~1 Joule/Coulomb.

For simplicity, the material may be assumed to be a simple well-behaved metal with high thermal conductivity. Therefore, in response to the heat flow input, $Q_{input}$, the non-linear rise in temperature different $\Delta T(t)$ from the indicated arbitrary unit time stamps between 0 to 50 shown in the plot of FIG. 3, is given by Equation 1 as follows:

$$\Delta T(t) = \frac{Q_{input}}{K}\left(1 - \exp^{\frac{-K}{nC_v}t}\right) \text{(Region } I\text{)} \qquad (1)$$

The rise in temperature for region I will continue until the Seebeck output voltage from the thermoelectric device induced by ΔT(t) reaches the set trigger voltage. When the Seebeck voltage and the trigger voltage are equal, then that marks the end of region I behavior.

The transition between region I and region II is marked at the arbitrary time-stamp of 50 in the plot of FIG. 3. At the transition, the temperature across the thermoelectric device results in a voltage that is sufficiently large to cause the Zener diode to trigger. The Zener diode breaks down and a voltage bias is then applied to the base of the enhancement mode ("normally-off") power transistor. That bias voltage causes the normally-off transistor to switch "on" mode, and electrical current can then begin to flow. This marks the beginning of region II. This condition is shown in the right illustration of FIG. 4.

In region II, electrical current flows through the power transistor 30 and also through the thermoelectric device 20. The effect of the electrical current flow through the thermoelectric device is that Peltier heat is absorbed from the hot side by the Peltier effect. That heat absorption (cooling) is quantitatively equal to the Peltier coefficient (Π) of the thermoelectric device multiplied by the magnitude of the electrical current, I. In this way, the current flow is said to cause Peltier cooling and therefore causes the temperature of the hot-side to decrease. There is an additional Joule heating term ($I^2R$) from the electrical resistance (R) of the thermoelectric device that acts counter to the Peltier heat, but is usually small. For Region II, the temperature difference across the thermoelectric device decreases as shown by the non-linear decrease in temperature ΔT(t) from the indicated arbitrary time stamps between 50 to 100 in the plot of FIG. 3. Equation 2 describes the decrease in ΔT(t) in Region II as follows:

$$\Delta T(t) = \frac{(Q_{input} + I^2R - \Pi * I)}{K}\left(1 - \exp^{\frac{-K}{nC_v}t}\right) \text{(Region } II\text{)} \qquad (2)$$

The decrease in ΔT(t) has a critically important effect, that is, the Seebeck (output) voltage from the thermoelectric device drops. When the Seebeck (output) voltage drops below the trigger voltage for the Zener diode, the bias voltage applied to the gate of the normally-off power transistor goes back to zero. A bias voltage of zero to the gate of the power transistor causes the normally-off transistor to revert back to the "off" mode, and current can no longer flow. When the electrical current flow stops, the Peltier heat absorption stops. This marks the end of region II.

Beyond region II in the plot of FIG. 3, the situation begins an exact repeat of the beginning of region I, and Equation 1 describes the thermal behavior as the temperature difference begins to increase again. For as long as there is an imposed static temperature difference across the thermoelectric device (via $Q_{input}$), the passive thermal oscillator will convert that to a persistently oscillating temperature difference by the invention described herein.

The amplitude and frequency of the thermal oscillation can be tuned by adjusting the heat capacity of the thermal masses on either side of the thermoelectric device, as well as the magnitudes of the passive analog components of the electrical circuit.

The novel passive thermal oscillator technology increases the conversion efficiency of devices that convert thermal energy into electrical energy and to reduce the logistical burden of supplying energy. Embodiments of the invention can be used to enhance the power output for strategies to directly convert thermal energy into electrical energy and vice-versa.

According to other embodiments, multiple energy conversion technologies can be integrated or combined to work cooperatively to convert thermal energy. For instance, the periodic temperature difference of the thermoelectric device can be coupled with a heat engine that generates power by oscillating across the Curie point of a material. The Curie point is the temperature at which certain materials lose their permanent magnetic properties to be replaced by induced magnetism. A temperature difference across a material's Curie temperature can induce periodic polarization and depolarization within the material, and that can generate electrical power. In the case of an oscillatory temperature difference, oscillating electrical power can be generated.

Curie point energy conversion technologies can include pyroelectric energy conversion, pyroferroelectric energy conversion, or magnetocaloric energy conversion, although various other Curie point engine technologies can be used or envisioned.

Pyroelectric energy conversion utilizes the pyroelectricity phenomenon to generate voltage when they are heated or cooled. A pyroelectric material is formed of a crystalline material (such as gallium nitride) which is naturally electrically polarized and contains large electric fields. The change in temperature modifies the positions of the atoms within the crystal structure which changes the polarization of the material and this generates a voltage. This voltage is relatively temporary due current leakage of electrons moving through and away from the crystalline material.

Electrocaloric energy conversion makes use of the electrocaloric effect in which a material shows a reversible temperature change under an applied electric field. It is often considered to be the inverse of the pyroelectric effect. The choice between pyroelectric and electrocaloric would be depend on the operation that a particular user desires. For example, if one wants useful electrical power to recharge a battery, then one could use the pyroelectric option because it provides more output voltage and power. On the other hand, if one wants to control the temperature, one might choose an electrocaloric material/device.

Pyro-ferroelectric energy conversion makes use of a ferroelectric material. Ferroelectric materials demonstrate a spontaneous nonzero polarization even when the applied electric field is zero. All ferroelectrics materials are inherently pyroelectric with the added property that their natural electrical polarization is reversible. The spontaneous polarization can be reversed by a suitably strong applied electric field in the opposite direction. One common ferroelectric material is lead zirconate titanate (PZT).

Magnetocaloric energy conversion uses the magnetocaloric effect in which exposing a material (most notably, gadolinium and its alloy $Gd_5Si_2Ge_2$) to a changing magnetic field causes a temperature change of the material. The temperature of the material increases as it enters certain magnetic fields and decreases when leaves the magnetic field.

These and other energy conversion technologies can be integrated or combined to work cooperatively to convert thermal energy. An integrated or combined system would yield a composite system that has a much higher overall thermodynamic conversion efficiency than the basic device in isolation. Such systems would have higher overall power per weight, higher efficiency, and reduced footprint in terms of higher power per area. That means more useful electrical power can be obtained from a given content of heat energy. As a result, this technology provides an increase to the system conversion efficiency above the limits of existing technologies acting in isolation.

For example, it may be assumed that a thermoelectric generator operating across some given ΔT(t) is roughly X % efficient. However, the technology proposed here would allow combined technologies (say simultaneous pyroelectric and thermoelectric conversion) to also oscillate across the Curie temperature of the pyroelectric material and obtain an additional Y % enhancement yielding an overall (X+Y) % system conversion efficiency. In this way, the normal and accepted conversion efficiency limits of either technology operating in isolation can be exceeded by the cooperative combination and simultaneous operation of both.

Figure 5:
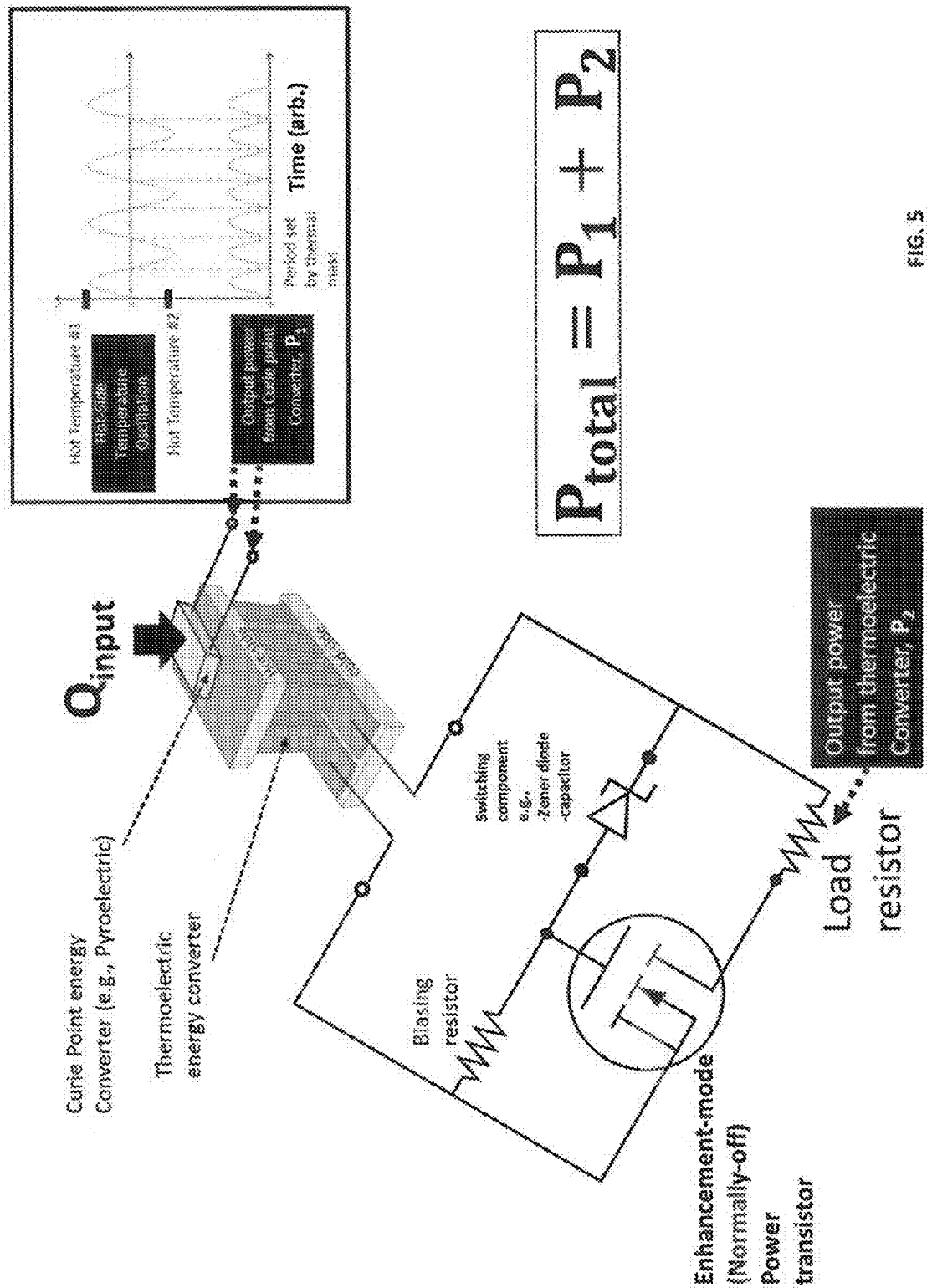
FIG. 5 shows a Curie point energy converter combined with a thermoelectric device according to an embodiment of the present invention.

FIG. 5 shows a Curie point energy converter (e.g., a pyroelectric device) combined with a thermoelectric device according to an embodiment of the present invention. The Curie point energy converter accepts the static heat input $Q_{input}$ which is transferred to the thermoelectric device and it outputs a voltage $P_1$. Initially, a static temperature difference develops between the "Hot" side and "Cold" side of the thermoelectric device as labeled on the figure. The output of the thermoelectric device is indicated at $P_2$ in FIG. 5 at the output voltage position of the thermoelectric converter.

The locations of the two different individual output power locations is indicated, and the sum of those $P_1$ and $P_2$ represents the total output $P_{total}$ for the two technologies operating together. The relation between the oscillation of temperature and output power for the Curie point converter is shown schematically. The period is set by thermal mass.

The plot at the top of FIG. 5 is a plot of the sinusoidal temperature operation of the thermoelectric device. The sinusoidal oscillation results from a constant heat input. As the switching circuit triggers "on" and "off," the output power oscillates. That oscillation causes the temperature of the second component (e.g., pyroelectric device) to pass through its Curie point. At every crossing of the Curie point, in either warming or cooling through the Curie point, there is an emission of electrical power.

The combined thermoelectric and pyroelectric device provides high power per unit weight and high power per unit area making it a suitable candidate for many mobile applications where waste heat could be useful or to serve as a redundant electrical power source. With the combined device, there are two different modes under which thermal energy can be converted to electrical energy. In the one mode, for thermoelectric energy conversion, a static temperature difference causes a flow of heat energy, which can be directly converted into electrical energy using a thermoelectric device. In the second mode, for pyroelectric energy conversion, an oscillatory temperature difference across a material's Curie temperature induces periodic polarization and depolarization within the material, and that can cause an oscillating electrical power.

Embodiments of the present invention provide a novel, unique physical and controllable device for temperature oscillation. More particularly, they provide a transient, time dependent behavior that can add significant performance advantage to thermoelectric devices, or facilitate the operation of energy conversion devices requiring a periodic temperature oscillation. This novel thermal oscillation can find use in many applications including the conversion of heat energy into electrical energy. This conversion can be from, e.g., waste heat from industrial processes or vehicular exhaust, into useful electrical energy to charge a battery. The technology can be used for applications where a plurality of energy conversion technologies can be combined and made to act cooperatively to produce larger overall system efficiency. It can also be useful for new transient-based advanced thermoelectric cooling and refrigeration applications.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. A passive thermal oscillator comprising:
   a thermoelectric device configured to generate an electrical output from thermal energy; and
   a passive analog electrical circuit, connected electrically to the electrical output of the thermoelectric device, and comprising an electrically-controlled switch and a switch biasing component configured to control the electrical current to pass or cease to pass through the switch,
   wherein the switch biasing component controls operation of the switch by triggering current to pass and cease to pass through the switch thereby causing the thermoelectric device to output an oscillating time dependent temperature response.

2. The oscillator of claim 1, wherein, when current passes through the switch to a load it causes periodic Peltier cooling in the thermoelectric device.

3. The oscillator of claim 1, wherein the electrically-controlled switch is a transistor, and the switch biasing component is a transistor-gate biasing component.

4. The oscillator of claim 3, wherein the transistor-gate biasing component is a diode, and the gate of the transistor will be biased when the voltage of the thermoelectric device exceeds the reverse-bias breakdown value or rating of the diode.

5. The oscillator of claim 1, wherein there is a substantially constant or static thermal input, and the oscillating time dependent temperature response is substantially periodic with each period comprising a first region and a second region.

6. The oscillator of claim 5, wherein,
   (i) in the first region, current does not pass through the switch, and the temperature of the thermoelectric device rises until the output voltage of the thermoelectric device reaches the set trigger voltage for the switch biasing component; and
   (ii) in the second region, current passes through the switch, and the temperature of the thermoelectric device decreases until the output voltage drops below the trigger voltage for the switch biasing component.

7. The oscillator of claim 6, wherein
(i) the temperature response in the first region is characterized as follows:

$$\Delta T(t) = \frac{Q_{input}}{K}\left(1 - \exp^{\frac{-K}{nC_v}t}\right);$$

and
(ii) the temperature response in the second region is characterized as follows:

$$\Delta T(t) = \frac{(Q_{input} + I^2 R - \Pi * I)}{K}\left(1 - \exp^{\frac{-K}{nC_v}t}\right),$$

where $\Delta T(t)$ is the change of temperature of the thermoelectric device, t is time, $Q_{input}$ is the heat flow input, $\Pi$ is the Peltier coefficient of the thermoelectric device, I is the magnitude of the electrical current, R is the electrical resistance of the thermoelectric device that acts counter to the Peltier heat, K is the thermal conductance of the thermoelectric, $C_v$ is the molar specific heat at constant volume, and n is the molar mass of the material receiving the heat.

8. The oscillator of claim 1, further comprising one or more terminals electrically connecting the passive analog electrical circuit to the thermoelectric device.

9. The oscillator of claim 8, wherein the one or more terminals comprise wires, electrodes, traces, or electrical conductors.

10. The oscillator of claim 1, further comprising: a Curie point energy converter connected to the thermoelectric device.

11. The oscillator of claim 10, wherein the Curie point energy converter comprises: a pyroelectric energy conversion device, a pyroferroelectric energy conversion device, or a magnetocaloric energy conversion device.

12. The oscillator of claim 1, wherein the passive analog electrical circuit is formed of only solid-state electrical components.

13. A method of using the passive thermal oscillator of claim 1, the method comprising:
    subjecting the oscillator to thermal energy.

14. The method of claim 13, wherein the thermal energy remains substantially static.

15. A method of forming the passive thermal oscillator of claim 1, the method comprising:
    coupling the thermoelectric device with the passive analog electrical circuit.

* * * * *